United States Patent
Santillan et al.

(10) Patent No.: US 10,277,223 B2
(45) Date of Patent: Apr. 30, 2019

(54) CHARGE INJECTION COMPENSATION CIRCUIT

(71) Applicant: Analog Devices Global, Hamilton (BM)

(72) Inventors: Jofrey G. Santillan, Gen. Trias (PH); David Aherne, Limerick (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/370,564

(22) Filed: Dec. 6, 2016

(65) Prior Publication Data

US 2018/0159523 A1     Jun. 7, 2018

(51) Int. Cl.
| | |
|---|---|
| *G11C 27/02* | (2006.01) |
| *G06F 3/042* | (2006.01) |
| *H02M 3/07* | (2006.01) |
| *G01R 31/30* | (2006.01) |
| *H03M 1/00* | (2006.01) |
| *H03K 17/16* | (2006.01) |

(52) U.S. Cl.
CPC ... *H03K 17/165* (2013.01); *H03K 2217/0054* (2013.01)

(58) Field of Classification Search
CPC .......... H03K 17/16; H03M 1/00; H02M 3/07; G11C 27/02; G06F 3/042; G06G 7/18
USPC ................ 327/148, 157, 534–537, 365–508; 363/59, 60
See application file for complete search history.

(56) References Cited

U.S. PATENT DOCUMENTS

| | | | |
|---|---|---|---|
| 6,005,433 A | 12/1999 | Hale | |
| 6,483,358 B2 | 11/2002 | Ingino, Jr. | |
| 6,597,217 B2 | 7/2003 | Ingino, Jr. | |
| 7,663,424 B2 | 2/2010 | Stulik | |
| 8,169,193 B2 | 5/2012 | Fitzgerald et al. | |
| 9,124,084 B2 | 9/2015 | Shinde | |
| 9,397,656 B2 | 7/2016 | Dribinsky et al. | |
| 9,574,907 B2 * | 2/2017 | Chevroulet | G01D 5/24 |
| 9,812,270 B2 * | 11/2017 | Takayama | H01H 9/547 |
| 2009/0256531 A1 * | 10/2009 | Fitzgerald | G11C 27/02 320/166 |
| 2010/0308886 A1 * | 12/2010 | Ogawa | G01R 33/072 327/307 |
| 2010/0315272 A1 * | 12/2010 | Steele | G01D 3/032 341/110 |
| 2012/0218032 A1 * | 8/2012 | Nadimpalli | H02M 3/073 327/536 |
| 2012/0313670 A1 * | 12/2012 | Thomas | G11C 7/02 327/109 |

(Continued)

*Primary Examiner* — Brandon S Cole
(74) *Attorney, Agent, or Firm* — Schwegman Lundberg & Woessner, P.A.

(57) ABSTRACT

A charge injection compensation circuit compensates for charge injection by a field-effect transistor (FET) switch regardless of a supply voltage. The charge injection compensation circuit includes a main switch that injects charge into an electronic circuit when switched off, and a charge storage device that stores the injected charge until it can be dissipated to a dissipating node. Upon the main switch being controlled to switch off, a pulse generator circuit controls a charge storage switch to switch on to transfer the charge injected from the main switch to the charge storage device and then switch off. A dissipation circuit dissipates the charge from the charge storage device to a dissipating node.

23 Claims, 8 Drawing Sheets

(56) References Cited

U.S. PATENT DOCUMENTS

2016/0104543 A1* 4/2016 Powell ................. G11C 27/026
                                                                327/96
2017/0162275 A1* 6/2017 Gao ...................... H02J 7/0021

* cited by examiner

CHARGE INJECTION COMPENSATION CIRCUIT

FIELD OF THE DISCLOSURE

The present disclosure relates to the field of switches for electronic circuits.

BACKGROUND

When an electronic switch disconnects a first circuit from a second circuit, the electronic switch can inject charge into the second circuit. For example, when the electronic switch is implemented using semiconductor field effect transistors (FETs), for example, n-type FET (NFET) devices and/or p-type FET (PFET) devices, the injected charge can be due to gate-to-drain charge stored in the FETs when the FETs were in a conducting mode of operation that is dissipated out of the FETs after the FETs change state to a non-conducting mode of operation.

SUMMARY OF THE DISCLOSURE

In theory, when a PFET transistor device and an NFET transistor device are arranged in parallel with one another in an electronic switch (e.g., as a parallel switch or "transmission gate") and sized correctly, the charge injection from the PFET device and the NFET device can cancel each other out, resulting in zero net charge injection at an output of the switch. However, this can only be achieved for one supply voltage, because of voltage-varying parameters of the devices. Also, when the PFET device is sized with a larger width than the NFET device, such as to achieve a same "on" resistance, the additional charge injected by the PFET device can be compensated at a single voltage, e.g., mid-rail voltage, using a basic capacitor compensation configuration. A resistor switched between the output of the parallel switch and ground for a predefined period of time after the parallel switch disconnects can also compensate for the charge injection by dissipating a predefined amount of charge, but is also only effective at one supply voltage, unless the value of the resistor is varied with supply voltage. The present inventors have recognized that there is a need for a charge injection compensation circuit that compensates for charge injection at a wide range of supply voltages without a need to change design parameters of the charge injection compensation circuit.

According to an embodiment, a charge injection compensation circuit compensates for charge injection by a field-effect transistor (FET) switch regardless of a supply voltage. The charge injection compensation circuit includes a main switch that injects charge into an electronic circuit when switched off, and a charge storage device that stores the injected charge until it can be dissipated to a dissipating node. Upon the main switch being controlled to switch off, a pulse generator circuit controls a charge storage switch to switch on to transfer the charge injected from the main switch to the charge storage device and switch off. A dissipation circuit dissipates the charge from the charge storage device to a dissipating node.

According to an embodiment, a charge injection compensation circuit includes a pulse generator circuit to generate a second control pulse in response to a received first control pulse. The circuit also includes a first switch that selectively couples a first node with a second node according to the first control pulse and injects charge into the second node when the first switch de-couples the first node from the second node. The circuit additionally includes a charge storage device and a second switch that selectively couples the charge storage device with the second node of the first switch according to the second control pulse to transfer charge from the second node of the first switch to the charge storage device. The second control pulse is timed to control the second switch to couple the charge storage device with the second node of the first switch upon the first control pulse controlling the first switch to de-couple the first node from the second node of the first switch. The circuit also includes a charge dissipation device that transfers charge from the charge storage device to a charge dissipating node.

According to an embodiment, a method of compensating a charge injection circuit includes receiving a first control pulse and selectively coupling a first node with a second node according to the first control pulse. The method also includes injecting charge into the second node when de-coupling the first node from the second node according to the first control pulse, and generating a second control pulse in response to the received first control pulse. The method also includes selectively coupling a charge storage device with the second node according to the second control pulse, where the second control pulse is timed to control the coupling of the charge storage device with the second node upon the de-coupling of the first node from the second node according to the first control pulse, and transferring charge from the second node to the charge storage device. The method further includes transferring charge from the charge storage device to a charge dissipating node.

According to an embodiment, a switching system that compensates for charge injection includes a pulse generator circuit to sequentially generate a second control pulse and a third control pulse in response to a received first control pulse. The system also includes a first electronic circuit, a second electronic circuit, and a first switch that selectively couples the first electronic circuit with the second electronic circuit according to the first control pulse and injects charge into the second electronic circuit when the first switch de-couples the first electronic circuit from the second electronic circuit. The system also includes a charge storage device and a second switch that selectively couples the charge storage device with the second electronic circuit according to the second control pulse to transfer charge from the first switch or the second electronic circuit to the charge storage device, where the second control pulse is timed to control the second switch to couple the charge storage device with the second electronic circuit upon the first control pulse controlling the first switch to de-couple the first electronic circuit from the second electronic circuit. The system also includes a third switch that selectively couples the charge storage device with a charge dissipating node according to the third control pulse to transfer charge from the charge storage device to the charge dissipating node, where the third control pulse is timed to control the third switch to couple the charge storage device with the charge dissipating node after the second control pulse controls the second switch to de-couple the charge storage device from the second electronic circuit.

This overview is intended to provide an overview of subject matter of the present patent application. It is not intended to provide an exclusive or exhaustive explanation of the invention. The detailed description is included to provide further information about the present patent application.

Figure 1A:
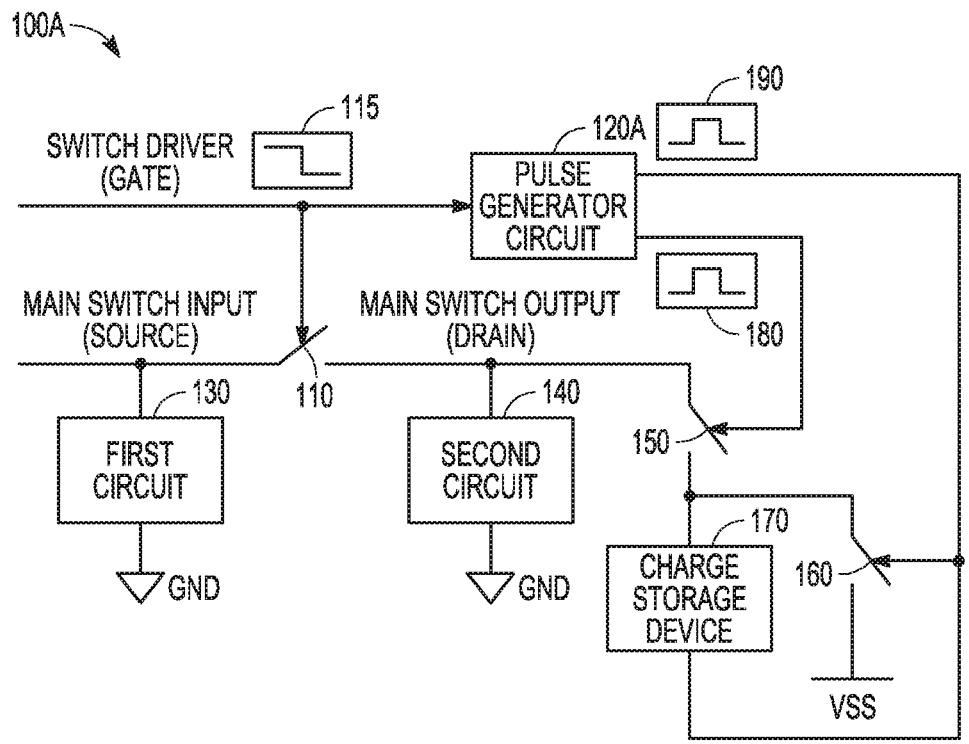
FIG. 1A illustrates a block diagram of a charge injection compensation circuit, according to an embodiment.

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

In various embodiments, the switches and other devices illustrated in FIGS. 1A-6 can be implemented by metal oxide semiconductor (MOS) devices, for example, n-type MOS (NMOS) devices and/or p-type MOS (PMOS) devices. While materials identified by the terms "metal" and "oxide" can be present in, for example, a MOS field effect transistor (MOSFET), MOS transistors can have gates made out of materials other than metals, such as polysilicon, and can have dielectric regions made from dielectrics other than silicon oxide, e.g., a high-k dielectric. In various embodiments, the devices illustrated in FIGS. 1A-6 can be implemented using other devices on silicon, compound semiconductor, or any other suitable semiconductor, for example, other field effect devices.

FIG. 1A illustrates a block diagram of a charge injection compensation circuit 100A, according to an embodiment. A main switch 110 selectively couples a switch input node MAIN SWITCH INPUT with a switch output node MAIN SWITCH OUTPUT according to a first control pulse 115 received at a switch driver node SWITCH DRIVER from a main switch decoder circuit of the main switch 110. The first control pulse 115 is also received by a pulse generator circuit 120A. The switch driver node SWITCH DRIVER can be coupled with a gate of a semiconductor transistor device such as a FET, the switch output node MAIN SWITCH OUTPUT can be coupled with a source of the semiconductor transistor device, and the switch output node can be coupled with a drain of the semiconductor transistor device. The main switch 110 can selectively couple a first circuit 130 with a second circuit 140 according to the first control pulse 115. The first circuit 130 and the second circuit 140 can be electronic circuits and can include semiconductor devices, e.g., semiconductor transistor devices.

When the main switch 110 de-couples the switch input node MAIN SWITCH INPUT and the first circuit 130 from the switch output node and the second circuit 140, the main switch 110 can inject electronic charge into the switch output node MAIN SWITCH OUTPUT and the second circuit 140. The main switch can also inject electronic charge into the switch input node MAIN SWITCH INPUT and the first circuit 130. To prevent the injected electronic charge from disrupting the integrity and accuracy of signal values of the second circuit 140, particularly if the second circuit 140 has a high input impedance, the charge injection compensation circuit 100A includes a first compensation switch 150 that selectively couples a charge storage device 170 with the switch output node MAIN SWITCH OUTPUT and the second circuit 140 according to a second control pulse 180 received from the pulse generator circuit 120A. The pulse generator circuit 120A can be triggered by the first control pulse 115 to generate the second control pulse 180. The first compensation switch 150 can include a semiconductor transistor device that includes a gate coupled with the pulse generator circuit 120A to receive the second control pulse 180, and a source and drain respectively coupled with the switch output node MAIN SWITCH OUTPUT of the main switch 110 and a first terminal of the charge storage device 170. When the second control pulse 180 controls the first compensation switch 150 to be in an on or conducting state, the first compensation switch 150 can transfer charge from the switch output node MAIN SWITCH OUTPUT of the main switch 110 to the charge storage device 170. The first compensation switch 150 likewise, through the switch output node MAIN SWITCH OUTPUT of the main switch 110, can transfer charge from the main switch 110, the second circuit 140, or both, when the first compensation switch 150 is in an on state. In various embodiments, the charge storage device 170 can include a polysilicon capacitor or a semiconductor device, e.g., an NMOS device, to mimic performance of the parasitic capacitance of the main switch 110, as discussed below.

The first compensation switch 150 can de-couple the switch output node MAIN SWITCH OUTPUT of the main switch 110 from the charge storage device 170 by switching to an off or non-conducting state according to the second control pulse 180 after the charge injected into the switch output node MAIN SWITCH OUTPUT of the main switch 110 or second circuit 140 by the main switch 110 has been transferred to the charge storage device 170. In order to be ready to receive additional charge transferred from the switch output node MAIN SWITCH OUTPUT of the main switch 110 or the second circuit 140 the next time the main switch 110 switches from an on or conducting state to an off or non-conducting state, the charge injection compensation circuit 100A includes a second compensation switch 160 that selectively couples the charge storage device 170 with a charge dissipating node according to a third control pulse 190 received from the pulse generator circuit 120A. The second compensation switch 160 can include a semiconductor transistor device that includes a gate coupled with the pulse generator circuit 120A to receive the third control pulse 190, and a source and drain respectively coupled with the first terminal of the charge storage device 170 and the charge dissipating node. The charge dissipating node can include a low voltage or negative voltage power supply rail VSS, for example. When the third control pulse 190 controls the second compensation switch 160 to be in an on or conducting state, the second compensation switch 160 can transfer charge from the charge storage device 170 to the charge dissipating node or the power supply rail VSS.

A second terminal of the charge storage device 170 can be coupled with the pulse generator circuit 120A to receive the third control pulse 190 or be set at a voltage level according to the third control pulse 190. This can facilitate transfer of the charge stored in the charge storage device 170 to the charge dissipating node by increasing the voltage level of the second terminal of the charge storage device 170 while the first terminal of the charge storage device 170 is coupled with the charge dissipating node by the second compensation switch 160 according to the third control pulse 190. In an embodiment, the second terminal of the charge storage device can be coupled to ground and not coupled with the pulse generator circuit 120A or set at a voltage level other than ground.

After being triggered by the received first control pulse 115, the pulse generator circuit 120A can coordinate the timing of the second control pulse 180 and the third control pulse 190 to be sequentially generated in a sequence to control the first compensation switch 150 and the second compensation switch 160 to be in an off or non-conducting state when the main switch 110 is in an on or conducting state, then control the first compensation switch 150 to switch to an on or conducting state to couple the charge storage device 170 with the switch output node MAIN SWITCH OUTPUT of the main switch 110 upon the first control pulse 115 controlling the main switch 110 to de-couple the switch input node MAIN SWITCH INPUT and first circuit 130 from the switch output node MAIN SWITCH OUTPUT and second circuit 140, then control the first compensation switch 150 to switch to an off or non-conducting state to de-couple the charge storage device 170 from the switch output node MAIN SWITCH OUTPUT of the main switch 110 and the second circuit 140 after the charge has been transferred to the charge storage device 170, then control the second compensation switch 160 to switch to an on or conducting state to couple the charge storage device 170 with the charge dissipating node or the power supply rail VSS after the second control pulse 180 controls the first compensation switch 150 to de-couple the switch output node MAIN SWITCH OUTPUT of the main switch 110 and second circuit 140 from the charge storage device 170, and then control the second compensation switch 160 to de-couple the charge storage device 170 from the charge dissipating node or the power supply rail VSS after the charge on the charge storage device 170 has been dissipated to the charge dissipating node or the power supply rail VSS. The pulse generator circuit 120A can control the first compensation switch 150 and the second compensation switch 160 to be in an off or non-conducting state whenever the main switch 110 is in an on or conducting state. The pulse generator circuit 120A can generate the second control pulse 180 and the third control pulse 190 as one-shot pulses, one individual pulse each for each time the first control pulse 115 controls the main switch 110 to switch from an on or conducting state to an off or non-conducting state. An amount of charge injected into the switch output node MAIN SWITCH OUTPUT by the main switch 110 when the main switch 110 is switched off can be determined according to circuit design parameters, so the time duration of the first control pulse 180 to control the first compensation switch 150 to couple the switch output node to the charge storage device 170 can be designed in advance to transfer the amount of charge injected into the switch output node MAIN SWITCH OUTPUT by the main switch 110 to the charge storage device 170 before the first control pulse 180 changes state to control the first compensation switch 150 to de-couple the switch output node MAIN SWITCH OUTPUT from the charge storage device 170. Likewise, the time duration of the second control pulse 190 to control the second compensation switch 160 to couple the charge storage device 170 to the charge dissipating node can be designed in advance to dissipate the amount of charge injected into the switch output node MAIN SWITCH OUTPUT by the main switch 110 and stored on the charge storage device 170 before the second control pulse 190 changes state to control the second compensation switch 160 to de-couple the charge storage device 170 from the charge dissipating node.

The main switch 110 can inject a fraction of a total amount of charge that the main switch 110 is capable of storing within its operational regions (e.g., conducting channels between source and drain nodes of semiconductor transistors) into each of the switch input node MAIN SWITCH INPUT and the switch output node MAIN SWITCH OUTPUT. The fraction can be about one half of the total amount of charge. The total charge can be split between the gate-to-source capacitance and the gate-to-drain capacitance of the main switch 110. Therefore, in order to store a total amount of the charge injected by the main switch 110 into the switch output node, the charge storage device 170 can be configured to have a total capacitance sufficient to store an amount of charge equivalent to the amount of the charge injected by the main switch 110 into the switch output node MAIN SWITCH OUTPUT. In addition, by sizing the charge storage device 170 to be large enough to store the amount of charge equivalent to the amount of the charge injected by the main switch 110 into the switch output node MAIN SWITCH OUTPUT, a duration of the second control signal 180 can be as long as it takes for the correct amount of charge to be transferred into the charge storage device 170, or longer, without causing too much charge to be transferred into the charge storage device 170. By setting the charge storage capacity of the charge storage device 170 to be equal to the amount of charge injected by the main switch 110 into the switch output node MAIN SWITCH OUTPUT, once the correct amount of charge is stored in the charge storage device 170, charge transference to the charge storage device 170 can end. Furthermore, when the main switch 110 is in an on or conducting state, the charge storage device 170 can be empty of charge.

Because the charge storage device 170 is de-coupled from the switch output node of the main switch 110 and the second circuit 140 during steady state operation, the second circuit 140 can operate without being affected by the additional capacitances of the charge storage device 170.

The first compensation switch 150 and the second compensation switch 160 can be much smaller in size and have a higher resistance than the main switch 110 to conduct much less current than the main switch 110, and therefore can have a much smaller charge injection effect than the main switch 110. For example, the first compensation switch 150 and the second compensation switch 160 can have an on resistance on the order of one kΩ. Any charge injection effect of the first compensation switch 150 and the second compensation switch 160 can be effectively negligible and not have a significant deleterious effect on the performance of the second circuit 140. In addition, because the first compensation switch 150 can be much smaller in size than the main switch 110, the first compensation switch 150 can be used without adding a parasitic capacitance to the switch output node MAIN SWITCH OUTPUT of the main switch 110.

In various embodiments, the charge injection compensation circuit 100A can include a multiplexer (MUX) that has a plurality of instances of main switches 110 to multiplex alternative instances of the first circuit 130 to couple with a single instance of the second circuit 140. The second circuit 140 can include an analog to digital converter that converts an analog signal into a digital signal, and each of the plurality of the main switches 110 can include circuits that generate analog signals, for example, sensor devices.

In various embodiments, embodiments of the charge storage device 170 and associated first and second compensation switches 150 and 160 as discussed above can be coupled with the switch input node MAIN SWITCH INPUT to compensate for charge injection at the input of the main switch 110.

Figure 1B:
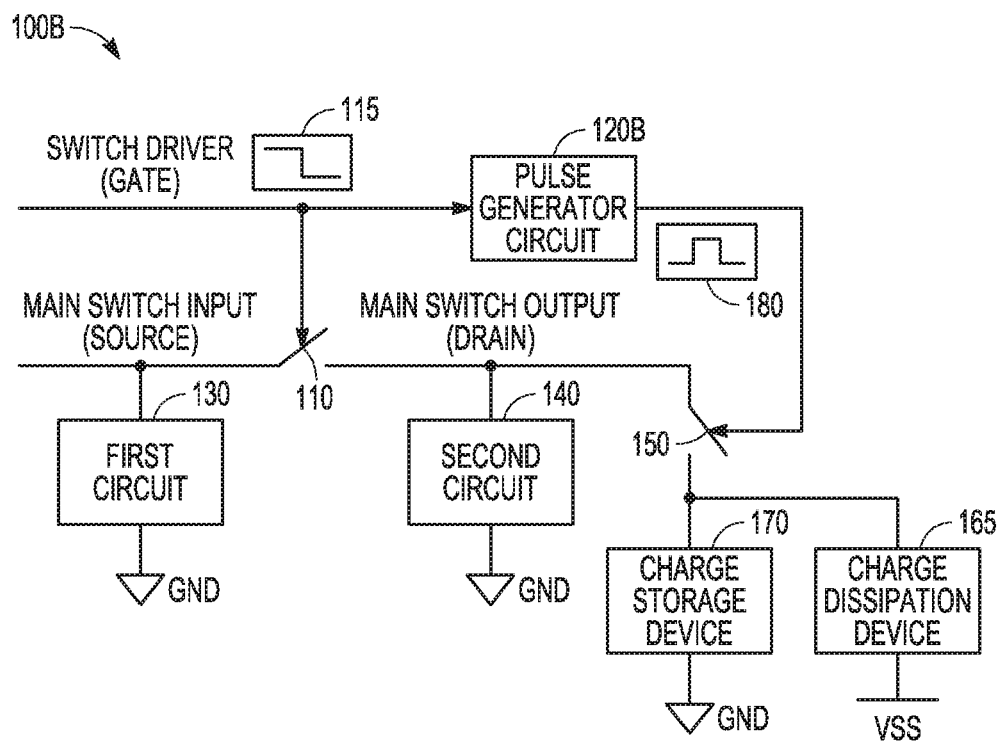
FIG. 1B illustrates a block diagram of a charge injection compensation circuit, according to an embodiment.

FIG. 1B illustrates a block diagram of a charge injection compensation circuit 100B, according to an embodiment. The charge injection compensation circuit 100B is similar to the charge injection compensation circuit 100A discussed with reference to FIG. 1A, except that the charge injection compensation circuit 100B includes a charge dissipation device 165 coupled between the charge storage device 170 and the charge dissipating node that can include a low voltage or negative voltage power supply rail VSS in place of the second compensation switch 160 controlled by the third control pulse 190, and a pulse generator circuit 120B that generates a second control pulse 180 in response to receiving a first control pulse 115. In addition, the charge storage device 170 of the charge injection compensation circuit 100B has a second terminal coupled with ground instead of having a varying voltage controlled by a third control pulse. The charge injection compensation circuit 100B operates in a manner similar to that of the charge injection compensation circuit 100A, except that the charge dissipation device 165 can dissipate the charge from the charge storage device 170 without controlled switching. For example, the charge dissipation device 165 can include a large value resistor that is set at a value that would facilitate the resistor to drain the charge stored on the charge storage device 170 to the charge dissipation node over a period of time, for example, a period of time between first control pulses or a period of time between second control pulses.

Figure 1C:
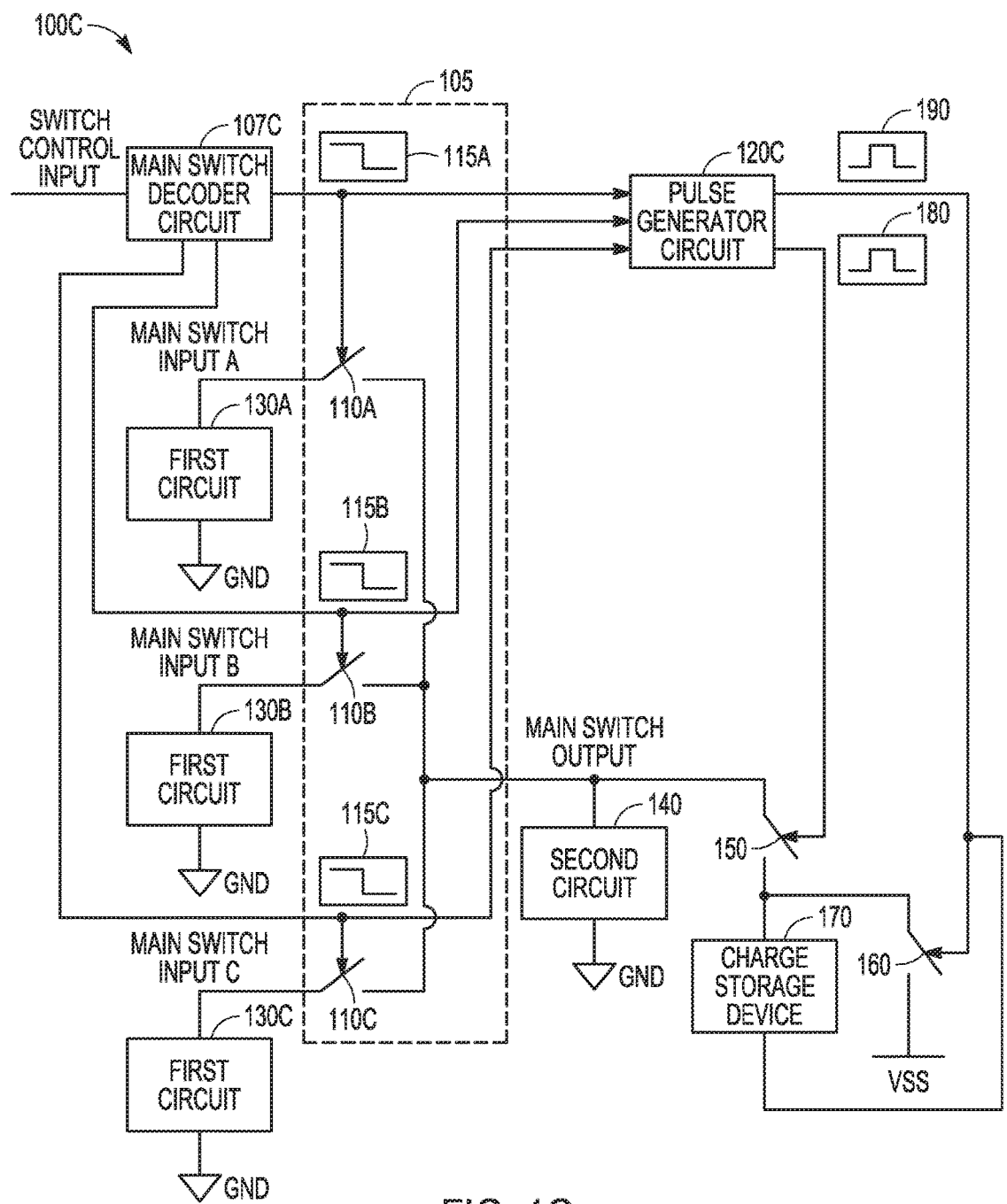
FIG. 1C illustrates a block diagram of a multiplexed system including a charge injection compensation circuit, according to an embodiment.

FIG. 1C illustrates a block diagram of a multiplexed system 100C including a charge injection compensation circuit, according to an embodiment. The embodiment of the multiplexed system 100C illustrated in FIG. 1C is only an example of a system that utilizes a charge injection compensation circuit similar to the charge injection compensation circuit 100A illustrated in FIG. 1A, and should not be construed as limiting, as various other systems having other configurations and functions can utilize a charge injection compensation circuit similar to the charge injection compensation circuit 100A or other embodiments of a charge injection compensation circuit according to the teachings herein.

The multiplexed system 100C includes a multiplexer 105 having inputs MAIN SWITCH INPUT A, MAIN SWITCH INPUT B, and MAIN SWITCH INPUT C that respectively couple first circuits 130A, 130B, and 130C via main switches 110A, 110B, and 110C with a shared switch output node MAIN SWITCH OUTPUT. The multiplexed system 100C can also include a main switch decoder circuit 107C that receives an input MUX control signal at an input node SWITCH CONTROL INPUT, decodes the input MUX control signal, and outputs first control pulses 115A, 115B, and 115C according to the input MUX control signal to control the main switches 110A, 110B, and 110C, respectively. In various embodiments, the first circuits 130A, 130B, 130C can include analog amplifier circuits, e.g., differential amplifier circuits, and the second circuit 140 can include a sample and hold circuit and an analog-to-digital converter, and the multiplexed system 110C can be a multiplexed analog-to-digital converter system.

The operation of the main switches 110A, 110B, and 110C can be controlled by the main switch decoder circuit 107C that generates the set of first control pulses 115A, 115B, 115C. In the embodiment of the multiplexed system 100C, the main switch decoder circuit 107C can control the first control pulses 115A, 115B, 115C such that only one of the first control pulses 115A, 115B, and 115C is active at a time to couple a selected one of the first circuits 130A, 130B, and 130C with the switch output node MAIN SWITCH OUTPUT. In an embodiment, a charge storage device 170 can be sized according to any one individual main switch 110A, 110B, 110C, because only one of the individual main switches 110A, 110B, and 110C would be changing state from a conducting state to a non-conducting state and injecting charge into the switch output node MAIN SWITCH OUTPUT at a same time. After being triggered by one of the first control pulses 115A, 115B, 115C, the pulse generator circuit 120C can time a second control pulse 180 and a third control pulse 190 to transfer the charge injected by the active one of the individual main switches 110A, 110B, 110C to the charge storage device 170 and dissipate the charge from the charge storage device 170 before another of the individual main switches 110A, 110B, 110C becomes active and injects charge into the switch output node MAIN SWITCH OUTPUT.

Figure 1D:
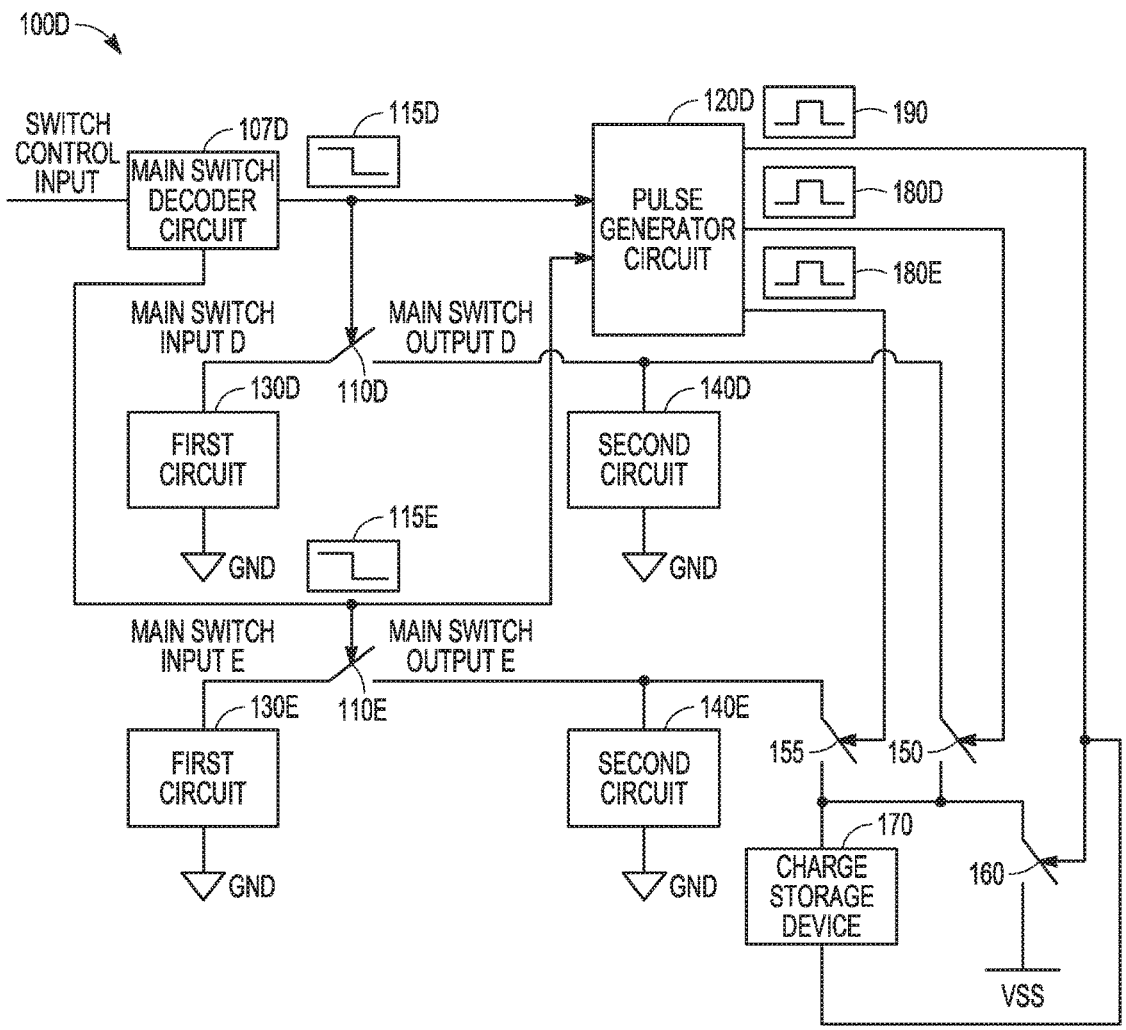
FIG. 1D illustrates a block diagram of a switch system including a charge injection compensation circuit, according to an embodiment.

FIG. 1D illustrates a block diagram of a switch system 100D including a charge injection compensation circuit, according to an embodiment. The embodiment of the switch system 100D illustrated in FIG. 1D is only an example of a system that utilizes a charge injection compensation circuit similar to the charge injection compensation circuit 100A illustrated in FIG. 1A, and should not be construed as limiting, as various other systems having other configurations and functions can utilize a charge injection compensation circuit similar to the charge injection compensation circuit 100A or other embodiments of a charge injection compensation circuit according to the teachings herein.

The switch system 100D includes a first circuit 130D at a switch input node MAIN SWITCH INPUT D coupled with a second circuit 140D at a switch output node MAIN SWITCH OUTPUT D by a main switch 110D according to a first control pulse 115D generated by a main switch decoder circuit 107D, and a first circuit 130E at a switch input node MAIN SWITCH INPUT E coupled with a second circuit 140E at a switch output node MAIN SWITCH OUTPUT E by a main switch 110E according to a first control pulse 115E generated by the main switch decoder circuit 107D. The main switch decoder circuit 107D can receive an input switch control signal at an input node SWITCH CONTROL INPUT, decode the input switch control signal, and output first control pulses 115D, 115E according to the input switch control signal to control the main switches 110D, 110E, respectively. The first compensation switch 150 couples the switch output node MAIN SWITCH OUTPUT D with the charge storage device 170 according to a second control pulse 180D, while a first compensation switch 155 couples the switch output node MAIN SWITCH OUTPUT E with the charge storage device 170 according to a second control pulse 180E.

The main switch decoder circuit 107D controls the operation of the main switches 110D, 110E by the set of first control pulses 115D, 115E. In an embodiment of the switch system 100D, the main switch decoder circuit 107D can control the first control pulses 115D, 115E such that only one of the first control pulses 115D, 115E is active at a time to couple a selected one of the first circuits 130D, 130E with the respective switch output node MAIN SWITCH OUT- PUT D or MAIN SWITCH OUTPUT E. In this embodiment, the charge storage device 170 can be sized according to any one individual main switch 110D, 110E, because only one of the individual main switches 110D, 110E would be changing state from a conducting state to a non-conducting state and injecting charge into the respective switch output node MAIN SWITCH OUTPUT D or MAIN SWITCH OUTPUT E at a same time.

When triggered by one of the first control pulses 115D, 115E received from the main switch decoder circuit 107D, the pulse generator circuit 120D can time the second control pulses 180D, 180E, and the third control pulse 190 to transfer the charge injected by the active one of the individual main switches 110D, 110E to the charge storage device 170 via a respective one of the first compensation switches 150, 155 and dissipate the charge from the charge storage device 170 before another of the individual main switches 110D, 110E becomes active and injects charge into the respective switch output node MAIN SWITCH OUTPUT D or MAIN SWITCH OUTPUT E.

In an embodiment of the switch system 100D, the main switch decoder circuit 107D can control the first control pulses 115D, 115E such that both of the first control pulses 115D, 115E are active at a time to couple both of the first circuits 130D, 130E with the respective switch output nodes MAIN SWITCH OUTPUT D and MAIN SWITCH OUTPUT E. In this embodiment, the charge storage device 170 can be sized according to a combination of the individual main switches 110D, 110E, because both of the individual main switches 110D, 110E can change state from a conducting state to a non-conducting state and inject charge into the respective switch output nodes MAIN SWITCH OUTPUT D and MAIN SWITCH OUTPUT E at a same time.

In an embodiment of the switch system 100D, the main switch decoder circuit 107D can control the first control pulses 115D, 115E such that both of the first control pulses 115D, 115E are active at a time to couple both of the first circuits 130D, 130E with the respective switch output nodes MAIN SWITCH OUTPUT D and MAIN SWITCH OUTPUT E, but do not turn off at a same time. Even if the input switch control signal received at the switch control input node SWITCH CONTROL INPUT of the main switch decoder circuit 107D were to signal that both the main switches 110D, 110E should turn off at the same time, the main switch decoder circuit 107D can introduce a delay in one of the first control pulses 115D, 115E relative to the other of the first control pulses 115D, 115E to prevent them both from changing to a logical low state and controlling both the main switches 110D, 110E to turn off at the same time. The first control pulses 115D, 115E can both turn on at a same time, or turn on at different times. In this embodiment, the charge storage device 170 can be sized according to just one of the individual main switches 110D, 110E, because both of the individual main switches 110D, 110E do not change state from a conducting state to a non-conducting state at a same time, and therefore do not inject charge into the respective switch output nodes MAIN SWITCH OUTPUT D and MAIN SWITCH OUTPUT E at a same time. In this embodiment, if the input switch control signal received at the switch control input node SWITCH CONTROL INPUT of the main switch decoder circuit 107D attempts to control both the main switches 110D, 110E to turn off at the same time, the main switch decoder circuit 107D can introduce timing delays to delay the state transition of one of the first control pulses 115D, 115E relative to the other to prevent both switches 110D, 110E changing to non-conducting state at the same time. For example, the first control pulse 115D could be controlled to change state before the first control pulse 115E.

In response to receiving a change in state from either or both of the first control pulses 115D, 115E, the pulse generator circuit 120D can time the second control pulses 180D, 180E and the third control pulse 190 to transfer the charge injected by corresponding ones of the individual main switches 110D, 110E to the charge storage device 170 via respective ones of the first compensation switches 150, 155 and dissipate the charge from the charge storage device 170 before the individual main switches 110D, 110E become active again and inject charge into the respective switch output nodes MAIN SWITCH OUTPUT D and MAIN SWITCH OUTPUT E.

For example, the main switch decoder circuit 107D can control the first control pulse 115D to change state from a high logical value to a low logical value, and in response, the pulse generator circuit 120D can generate a second control pulse 180D to close the compensation switch 150 for a time period to transfer charge from the main switch 110D's output node MAIN SWITCHOUTPUT D to the charge storage device 170. Once the second control pulse 180D is completed to open the compensation switch 150 again, the pulse generator circuit 120D can generate a third control pulse 190 to close the compensation switch 160 to dissipate the charge stored in the charge storage device 170. Once this cycle is complete and the charge injected by the main switch 110D is dissipated, the main switch decoder circuit 107D can control the first control pulse 115E to change state from a high logical value to a low logical value, and in response, the pulse generator circuit 120D can generate a second control pulse 180E to close the compensation switch 155 for a time period to transfer charge from the main switch 110E's output node MAIN SWITCHOUTPUT E to the charge storage device 170. Once the second control pulse 180E is completed to open the compensation switch 155 again, the pulse generator circuit 120D can generate a third control pulse 190 to close the compensation switch 160 to dissipate the charge stored in the charge storage device 170. This sequence of control pulses facilitates one charge storage device 170 to be shared among many independent main switches (e.g., 110D, 110E) by regulating the timing by which the independent main switches are turned off.

Figure 2:
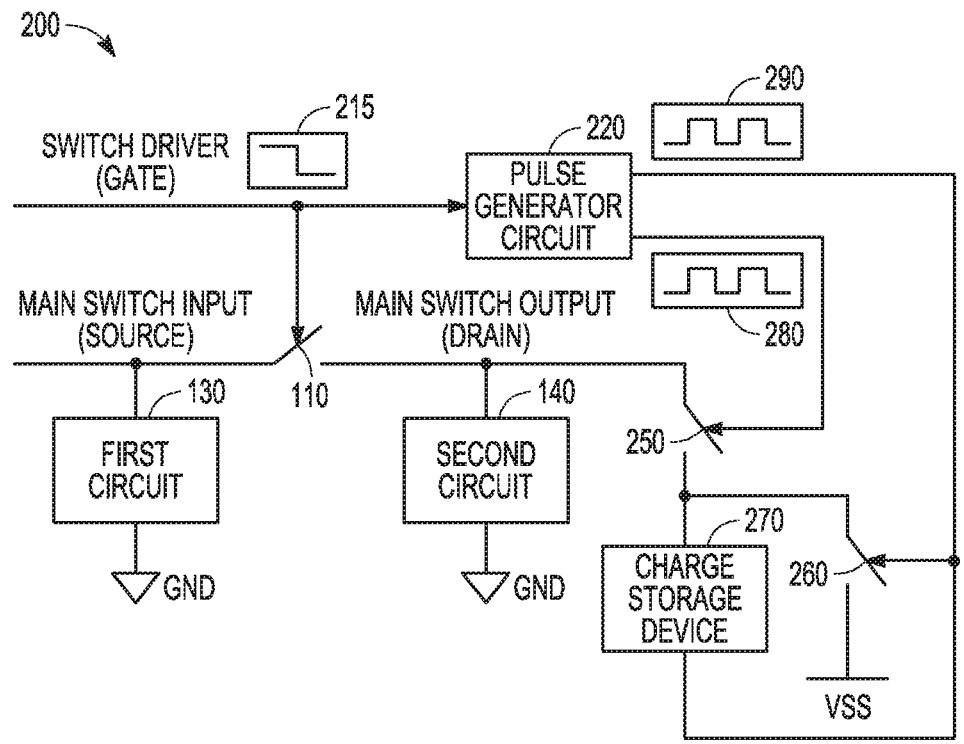
FIG. 2 illustrates a block diagram of a charge injection compensation circuit, according to an embodiment.

FIG. 2 illustrates a block diagram of a charge injection compensation circuit 200, according to an embodiment. The charge injection compensation circuit 200 is similar to the charge injection compensation circuit 100A discussed with reference to FIG. 1A, except that the charge injection compensation circuit 200 includes a pulse generator circuit 220 that generates a plurality of alternating second control pulses 280 and third control pulses 290 upon receiving a first control pulse 215 that controls a main switch 110 to change state to an off or non-conducting state. Using this technique, the charge storage capacity and consequently the size of a charge storage device 270 of the charge injection compensation circuit 200 can be smaller than that of the charge storage device 170 of the charge injection compensation circuit 100A. For example, having three second control pulses 280 alternating with three third control pulses 290 that each have a duration sufficient for respective controlled first compensation switch 250 to transfer one third of the charge injected by the main switch 110 to the charge storage device 270 and controlled second compensation switch 260 to dissipate the charge stored on the charge storage device 270 to the charge dissipating node facilitates the charge storage device 270 to have one third of the charge storage capacity of the charge storage device 170 for a given amount of charge injected by the main switch 110. This approach can save space on semiconductor substrates for circuits that include the charge injection compensation circuit 200 compared to circuits that include the charge injection compensation circuit 100A, since less charge is transferred per second control pulse 280 and third control pulse 290, and consequently the charge storage device 270 can be smaller since it can store less charge than the charge storage device 170. In general, a charge storage capacity and consequently a size of the charge storage device 270 can be related to the charge storage capacity of the main switch 110 and the number of second control pulses 280 and third control pulses 290 that alternate after each first control pulse 215 that controls the main switch 110 to change state to an off or non-conducting state as follows, assuming half of the charge injected by the main switch 110 is injected into the switch output node MAIN SWITCH OUTPUT of the main switch 110, and half is injected into the switch input node MAIN SWITCH INPUT of the main switch 110:

$$C_{CSD}=C_{MS}\times 1/(2\times N)$$

where $C_{CSD}$ is the charge storage capacity of the charge storage device 270 and $C_{MS}$ is the charge storage capacity of the main switch 110 such that the charge storage device 270 can store an amount of charge equivalent to 1/N times an amount of charge injected by the main switch 110 into the switch output node MAIN SWITCH OUTPUT of the main switch 110. N is the number of alternating cycles of the second control pulse 280 and the third control pulse 290 that together transfer a total amount of the charge injected from the main switch 110 into the switch output node MAIN SWITCH OUTPUT. For example, assuming half of the charge injected by the main switch 110 is injected into the switch output node MAIN SWITCH OUTPUT, for the charge storage capacity of the charge storage device 270 to be able to store one half of the charge injected by the main switch 110 into the switch output node MAIN SWITCH OUTPUT, the charge storage capacity of the charge storage device 270 should be one quarter of the charge storage capacity of the main switch 110, and N=2 so that there would be two alternating cycles of the second control pulse 280 and the third control pulse 290 upon the first control pulse 215 controlling the main switch 110 to de-couple the switch input node MAIN SWITCH INPUT from the switch output node MAIN SWITCH OUTPUT of the main switch 110.

In various embodiments, the embodiments of FIGS. 1B, 1C, and 1D can also be modified in a manner similar to that of the embodiment of FIG. 2 compared to FIG. 1A as described above to facilitate making the charge storage device 170 smaller than in the embodiments of FIGS. 1B, IC, and ID.

Figure 3:
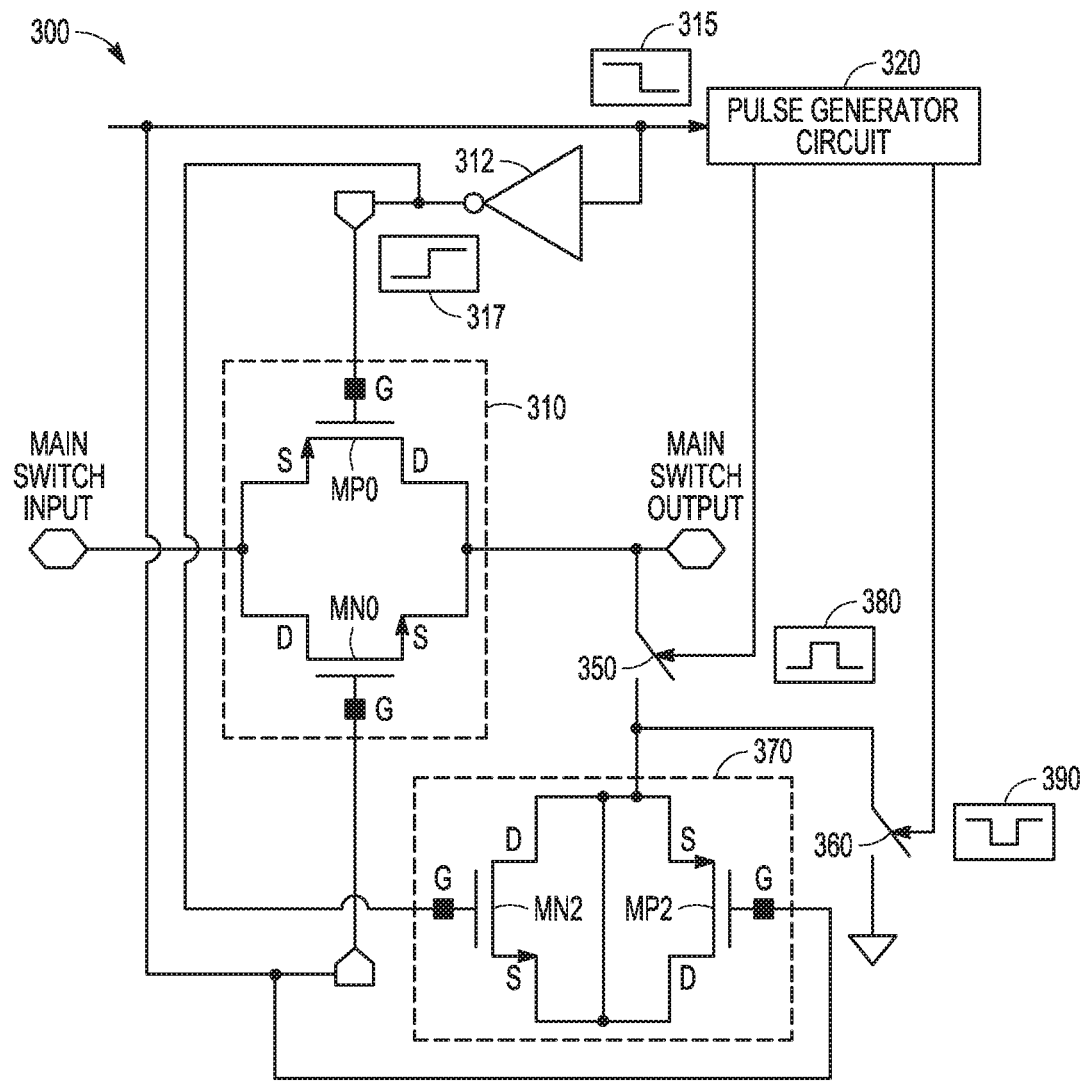
FIG. 3 illustrates a block diagram of a charge injection compensation circuit, according to an embodiment.

FIG. 3 illustrates a block diagram of a charge injection compensation circuit 300, according to an embodiment. The charge injection compensation circuit 300 is an embodiment of the charge injection compensation circuit 100A. The charge injection compensation circuit 300 includes a main switch 310 having an NMOS transistor MN0 coupled in parallel with a PMOS transistor MP0 between a switch input node MAIN SWITCH INPUT and a switch output node MAIN SWITCH OUTPUT. A source S of the PMOS transistor MP0 and a drain D of the NMOS transistor MN0 couple with the switch input node MAIN SWITCH INPUT, while a drain D of the PMOS transistor MP0 and a source S of the NMOS transistor MN0 couple with the switch output node MAIN SWITCH OUTPUT. A gate G of the NMOS transistor MN0 is coupled with a pulse generator circuit 320 to receive a first control pulse 315 along with the pulse generator circuit 320, while a gate G of the PMOS transistor MP0 is coupled with an inverter 312 to receive an inverted first control pulse 317, and the inverter 312 is coupled with the pulse generator circuit 320 to receive the first control pulse 315 along with the pulse generator circuit 320 and output the inverted first control pulse 317 as an inverted representation of the first control pulse 315. The main switch 310 selectively couples the switch input node MAIN SWITCH INPUT with the switch output node MAIN SWITCH OUTPUT according to the first control pulse 315. The first control pulse 315 can be received from a main switch decoder circuit of the main switch 310.

When the main switch 310 de-couples the switch input node MAIN SWITCH INPUT from the switch output node MAIN SWITCH OUTPUT, the main switch 310 can inject electronic charge into the switch output node MAIN SWITCH OUTPUT. To prevent this injected electronic charge from disrupting the integrity and accuracy of signal values of any circuits coupled with the switch output node MAIN SWITCH OUTPUT, the charge injection compensation circuit 300 includes a first compensation switch 350 that selectively couples a charge storage device 370 with the switch output node MAIN SWITCH OUTPUT according to a second control pulse 380 received from the pulse generator circuit 320. The first compensation switch 350 can include a semiconductor transistor device that includes a gate coupled with the pulse generator circuit 320 to receive the second control pulse 380, and a source and drain respectively coupled with the switch output node MAIN SWITCH OUTPUT of the main switch 310 and a first terminal of the charge storage device 370. When the second control pulse 380 controls the first compensation switch 350 to be in an on or a conducting state, the first compensation switch 350 can transfer charge from the switch output node MAIN SWITCH OUTPUT of the main switch 310 to the charge storage device 370. The first compensation switch 350 likewise, through the switch output node MAIN SWITCH OUTPUT of the main switch 310, can transfer charge from the main switch 310 when the first compensation switch 350 is in an on or conducting state.

The charge storage device 370 includes an NMOS transistor MN2 coupled in parallel with a PMOS transistor MP2 with each of a source S of the PMOS transistor MP2, a drain D of the NMOS transistor MN2, a drain D of the PMOS transistor MP2, and a source S of the NMOS transistor MN0 coupled with first compensation switch 350 to receive charge transferred from the switch output node MAIN SWITCH OUTPUT of the main switch 310 according to the second control pulse 380. A gate G of the PMOS transistor MP2 is coupled with the gate G of the NMOS transistor MN0 of the main switch 310 and the pulse generator circuit 320 to receive the first control pulse 315 along with the gate G of the NMOS transistor MN0 of the main switch 310 and the pulse generator circuit 320, while a gate G of the NMOS transistor MN2 is coupled with the inverter 312 and the gate G of the PMOS transistor MP0 of the main switch 310 to receive the inverted first control pulse 317. The active regions of the charge storage device 370 that store charge can be conducting channels between source and drain nodes of the NMOS transistor MN2 and the PMOS transistor MP2. The NMOS transistor MN2 and the PMOS transistor MP2 can be half a size of the corresponding NMOS transistor MN0 and PMOS transistor MP0 of the main switch 310 and the charge storage device 370 can accordingly be referred to as a half switch. The NMOS transistor MN2 and the PMOS transistor MP2 of the charge storage device 370 can have relative dimensions that correspond with the relative dimensions of the NMOS transistor MN0 and the PMOS transistor MP0 of the main switch 310, although the devices of the charge storage device 370 are overall half the size of the devices of the main switch 310. The active regions of the charge storage device 370 can have a charge storage capacity equivalent to the charge injected by the main switch 310 into the switch output node MAIN SWITCH OUTPUT because the NMOS transistor MN2 and the PMOS transistor MP2 are configured as half the size of the corresponding NMOS transistor MN0 and PMOS transistor MP0 of the main switch 310. By being designed as a half switch that is half the size of the main switch 310, the charge storage device 370 can have a correct charge storage capacity and more accurately track the performance characteristics of the main switch 310 through any manufacturing process or operational parameter variations than a charge storage device other than a half switch, for example, a polysilicon capacitor.

Because the NMOS transistor MN2 and the PMOS transistor MP2 are configured to be activated in an on or conducting state when the corresponding NMOS transistor MN0 and PMOS transistor MP0 of the main switch 310 are configured to be deactivated in an off or non-conducting state according to their polarity-reversed gate connections, the NMOS transistor MN2 and the PMOS transistor MP2 can receive and store charge from the switch output of the main switch 310 upon receiving the first control pulse 315 that control the main switch 310 to de-couple the switch input node MAIN SWITCH INPUT from the switch output node MAIN SWITCH OUTPUT and consequently inject charge into the switch output node MAIN SWITCH OUTPUT, and upon the first compensation switch 350 being controlled to be activated in on or conducting state according to the second control pulse 380.

The first compensation switch 350 can de-couple the switch output node MAIN SWITCH OUTPUT of the main switch 310 from the charge storage device 370 by deactivating to an off or non-conducting state according to the second control pulse 380 after the charge injected into the switch output node MAIN SWITCH OUTPUT by the main switch 310 has been transferred to the charge storage device 370. In order to be ready to receive additional charge transferred from the switch output node MAIN SWITCH OUTPUT of the main switch 310 the next time the main switch 310 switches from an on or conducting state to an off or non-conducting state, the charge injection compensation circuit 300 includes a second compensation switch 360 that selectively couples the charge storage device 370 with a charge dissipating node according to a third control pulse 390 received from the pulse generator circuit 320. The second compensation switch 360 can include a semiconductor transistor device that includes a gate coupled with the pulse generator circuit 320 to receive the third control pulse 390, and a source and drain respectively coupled with the charge storage device 370 and the charge dissipating node. The charge dissipating node can include a low voltage or negative voltage power supply rail VSS, for example. When the third control pulse 390 causes the second compensation switch 360 to be in an on or a conducting state, the second compensation switch 360 can transfer charge from the charge storage device 370 to the charge dissipating node or the power supply rail VSS.

The pulse generator circuit 320 can coordinate the timing of the second control pulse 380 and the third control pulse 390 in response to receiving the first control pulse 315, with the second control pulse 380 and the third control pulse 390 sequentially generated in a sequence to control the first compensation switch 350 and the second compensation switch 360 to be in an off or non-conducting state when the main switch 310 is in an on or conducting state, then control the first compensation switch 350 to switch to an on or conducting state to couple the charge storage device 370 with the switch output node MAIN SWITCH OUTPUT of the main switch 310 upon the first control pulse 315 controlling the main switch 310 to de-couple the switch input node MAIN SWITCH INPUT from the switch output node MAIN SWITCH OUTPUT, then control the first compensation switch 350 to switch to an off or non-conducting state to de-couple the charge storage device 370 from the switch output node MAIN SWITCH OUTPUT of the main switch 310 after the charge has been transferred to the charge storage device 370, then control the second compensation switch 360 to switch to an on or conducting state to couple the charge storage device 370 with the charge dissipating node or the power supply rail VSS after the second control pulse 380 controls the first compensation switch 350 to de-couple the switch output node MAIN SWITCH OUTPUT of the main switch 310 from the charge storage device 370, and then control the second compensation switch 360 to de-couple the charge storage device 370 from the charge dissipating node or the power supply rail VSS after the charge on the charge storage device 370 has been dissipated to the charge dissipating node or the power supply rail VSS. The pulse generator circuit 320 can control the first compensation switch 350 and the second compensation switch 360 to be in an off or non-conducting state whenever the main switch 310 is in an on or conducting state. The pulse generator circuit 320 can generate the second control pulse 380 and the third control pulse 390 as one-shot pulses, one individual pulse each for each time the first control pulse 315 controls the main switch 310 to switch from an on or conducting state to an off or non-conducting state. An amount of charge injected into the switch output node MAIN SWITCH OUTPUT by the main switch 310 when the main switch 310 is switched off can be determined according to circuit design parameters, so the time duration of the first control pulse 380 to control the first compensation switch 350 to couple the switch output node MAIN SWITCH OUTPUT to the charge storage device 370 can be designed in advance to transfer the amount of charge injected into the switch output node MAIN SWITCH OUTPUT by the main switch 310 to the charge storage device 370 before the first control pulse 380 changes state to control the first compensation switch 350 to de-couple the switch output node MAIN SWITCH OUTPUT from the charge storage device 370. Likewise, the time duration of the second control pulse 390 to control the second compensation switch 360 to couple the charge storage device 370 to the charge dissipating node can be designed in advance to dissipate the amount of charge injected into the switch output node MAIN SWITCH OUTPUT by the main switch 310 and stored on the charge storage device 370 before the second control pulse 390 changes state to control the second compensation switch 360 to de-couple the charge storage device 370 from the charge dissipating node.

The main switch 310 can inject half of a total amount of charge that the main switch 310 is capable of storing within its operational regions (e.g., conducting channels between source and drain nodes of semiconductor transistors) into each of the switch input node MAIN SWITCH INPUT and the switch output node MAIN SWITCH OUTPUT. Therefore, in order to store a total amount of the charge injected by the main switch 310 into the switch output node MAIN SWITCH OUTPUT, the charge storage device 370 can be configured as a half switch to have a total charge storage capacity sufficient to store an amount of charge equivalent to the amount of the charge injected by the main switch 310 into the switch output node MAIN SWITCH OUTPUT, or a total charge storage capacity equal to half of the charge storage capacity of the main switch 310. In addition, by sizing the NMOS transistor MN2 and the PMOS transistor MP2 to be large enough to store the amount of charge equivalent to the amount of the charge injected by the main switch 310 into the switch output node MAIN SWITCH OUTPUT, a duration of the second control signal 380 can be as long as it takes for the correct amount of charge to be transferred into the charge storage device 370, or longer, without causing too much charge to be transferred into the charge storage device 370. By configuring the charge storage device 370 as a half switch, once the correct amount of charge is stored in the charge storage device 370, charge transference to the charge storage device 370 can end. Furthermore, when the main switch 310 is in an on or conducting state, the charge storage device 370 can be empty of charge.

Because the charge storage device 370 is de-coupled from the switch output node MAIN SWITCH OUTPUT of the main switch 310 and any circuits coupled with the switch output node MAIN SWITCH OUTPUT of the main switch 310 during steady state operation, the circuits coupled with the switch output node MAIN SWITCH OUTPUT of the main switch 310 can operate without being affected by the additional capacitances of the active regions of the NMOS transistor MN2 and the PMOS transistor MP2 that store charge in the charge storage device 370.

The first compensation switch 350 and the second compensation switch 360 can be much smaller in size and have a higher resistance than the main switch 310 to conduct much less current than the main switch 310, and therefore can have a much smaller charge injection effect than the main switch 310. For example, the first compensation switch 150 and the second compensation switch 160 can have an on resistance on the order of one kΩ. Any charge injection effect of the first compensation switch 350 and the second compensation switch 360 can be effectively negligible and not have a significant deleterious effect on the performance of any electronic circuits coupled with the switch output node MAIN SWITCH OUTPUT of the main switch 310. In addition, because the first compensation switch 350 can be much smaller in size than the main switch 310, the first compensation switch 350 can be used without adding a parasitic capacitance to the switch output node MAIN SWITCH OUTPUT of the main switch 310.

The half switch configuration of the charge storage device 370 can also compensate for gate drive feed-through. Gate drive feed-through can occur when the main switch 310 is turned on or off rapidly by the first control pulse 315. Some of the energy of switching the state of the main switch 310 can couple through gate-source and gate-drain capacitances of the NMOS transistor MN0 and the PMOS transistor MP0 of the main switch 310 to appear as signal disturbances at the switch output node MAIN SWITCH OUTPUT. The NMOS transistor MN2 and the PMOS transistor MP2 of the half switch configuration of the charge storage device 370 can be operative to cancel the gate drive feed-through disturbance when the antiphase drive signals of the NMOS transistor MN2 and the PMOS transistor MP2 are well matched with the drive signals of the NMOS transistor MN0 and the PMOS transistor MP0 of the main switch 310.

In various embodiments, embodiments of the charge storage device 370 and associated first and second compensation switches 350 and 360 as discussed above can be coupled with the switch input node MAIN SWITCH INPUT to compensate for charge injection at the input of the main switch 310.

Figure 4:
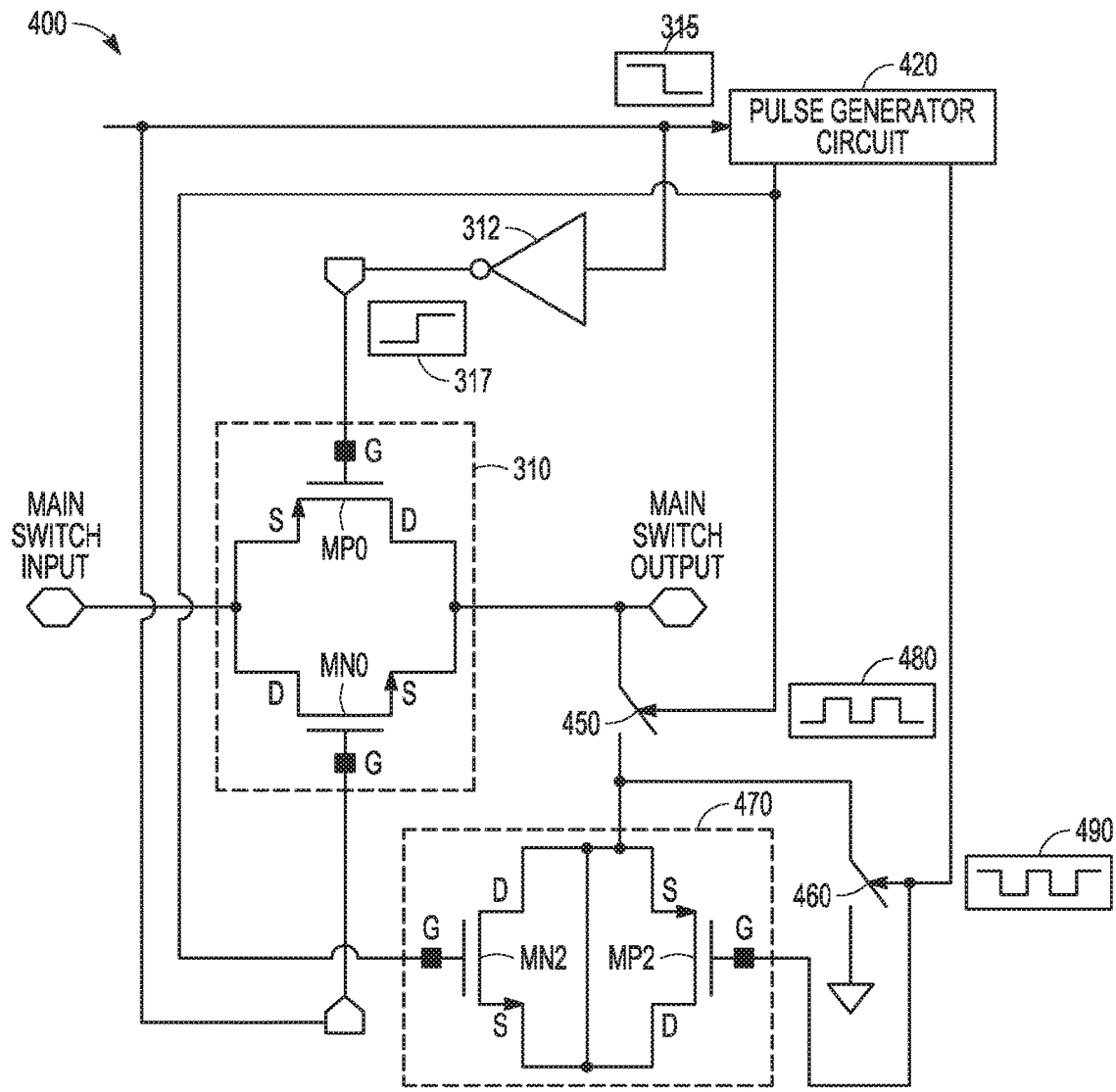
FIG. 4 illustrates a block diagram of a charge injection compensation circuit, according to an embodiment.

FIG. 4 illustrates a block diagram of a charge injection compensation circuit 400, according to an embodiment. The charge injection compensation circuit 400 is similar to the charge injection compensation circuit 300 discussed with reference to FIG. 3, except that the charge injection compensation circuit 400 includes a pulse generator circuit 420 that generates a plurality of alternating second control pulses 480 and third control pulses 490 upon receiving a first control pulse 315 that controls the main switch 310 to change state to an off or non-conducting state. In addition, the gates G of NMOS transistor NM2 and PMOS transistor MP2 of a charge storage device 370 are coupled with the pulse generator circuit 420 to respectively receive the second control pulse 480 and third control pulse 490. Using this technique, the charge storage capacity and consequently the size of the NMOS transistor NM2 and PMOS transistor MP2 of the charge storage device 470 of the charge injection compensation circuit 400 can be smaller than those of the corresponding charge storage device 370 of the charge injection compensation circuit 300. For example, having three second control pulses 480 alternating with three third control pulses 490 that each have a duration sufficient for respective controlled first compensation switch 450 to transfer one third of the charge injected by the main switch 310 to the charge storage device 470 and controlled second compensation switch 460 to dissipate the charge stored on the charge storage device 470 to the charge dissipating node facilitates the charge storage device 470 to have one third of the charge storage capacity of the charge storage device 370 for a given amount of charge injected by the main switch 310. This approach can save space on semiconductor substrates for circuits that include the charge injection compensation circuit 400 compared to circuits that include the charge injection compensation circuit 300, since less charge is transferred per second control pulse 480 and third control pulse 490, and consequently the charge storage device 470 can be smaller since it can store less charge than the charge storage device 370. In general, a charge storage capacity and consequently a size of the charge storage device 470 can be related to the charge capacity of the main switch 310 and the number of second control pulses 480 and third control pulses 490 that alternate after each first control pulse 315 that controls the main switch 310 to change state to an off or non-conducting state as follows:

$$C_{CSD} = C_{MS} \times 1/(2 \times N)$$

where $C_{CSD}$ is the charge storage capacity of the charge storage device 470 and $C_{MS}$ is the charge storage capacity of the main switch 310 such that the charge storage device 470 can store an amount of charge equivalent to 1/N times an amount of charge injected by the main switch 310 into the switch output node MAIN SWITCH OUTPUT of the main switch 310. N is the number of alternating cycles of the second control pulse 480 and the third control pulse 490 that together transfer a total amount of the charge injected from the main switch 310 into the switch output node MAIN SWITCH OUTPUT. For example, assuming half of the charge injected by the main switch 310 is injected into the switch output node MAIN SWITCH OUTPUT, for the charge storage capacity of the charge storage device 470 to be able to store one half of the charge injected by the main switch 310 into the switch output node MAIN SWITCH OUTPUT, the charge storage capacity of the charge storage device 470 should be one quarter of the charge storage capacity of the main switch 310, and N=2 so that there would be two alternating cycles of the second control pulse 480 and the third control pulse 490 upon the first control pulse 315 controlling the main switch 310 to de-couple the switch input node MAIN SWITCH INPUT from the switch output node MAIN SWITCH OUTPUT of the main switch 310.

Figure 5:
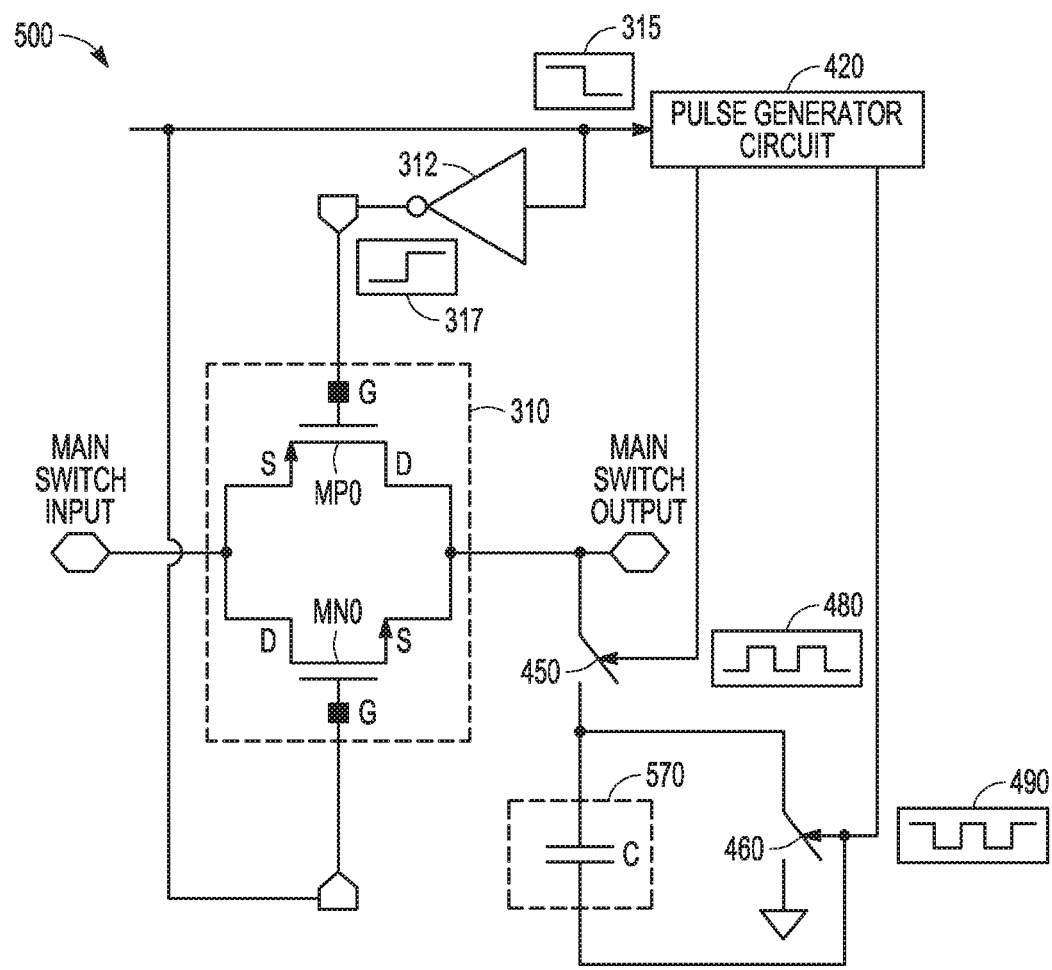
FIG. 5 illustrates a block diagram of a charge injection compensation circuit, according to an embodiment.

FIG. 5 illustrates a block diagram of a charge injection compensation circuit 500, according to an embodiment. The charge injection compensation circuit 500 is similar to the charge injection compensation circuit 400 discussed with reference to FIG. 4, except that the charge injection compensation circuit 500 includes a charge storage device 570 having a capacitor of a capacitance value C instead of a half switch including NMOS transistor NM2 and PMOS transistor MP2 as included in the charge storage device 370. The capacitor of the charge storage device 570 can include a polysilicon capacitor or a semiconductor device. For example, the capacitor of the charge storage device 570 can be constructed on a semiconductor substrate to have physical dimensions similar to one half of the semiconductor transistors of the main switch 310 in order to have similar or matching capacitive and operational characteristics as half of the main switch 310.

While a first terminal of the capacitor of the charge storage device 570 is coupled with the first compensation switch 450, a second terminal of the capacitor of the charge storage device 570 is coupled with the pulse generator circuit 420 to receive or have a voltage value controlled by the third control pulse 490.

Using this technique, the capacitance value C and consequently the size of the capacitor of the charge storage device 570 of the charge injection compensation circuit 500 can be smaller than those of the corresponding charge storage device 370 of the charge injection compensation circuit 300, and also the overall semiconductor footprint of the charge storage device 570 can be smaller than that of the charge storage device 470. For example, having three second control pulses 480 alternating with three third control pulses 490 that each have a duration sufficient for respective controlled first compensation switch 450 to transfer one third of the charge injected by the main switch 310 to the charge storage device 470 and controlled second compensation switch 460 to dissipate the charge stored on the charge storage device 570 to the charge dissipating node facilitates the charge storage device 570 to have one third of the charge storage capacity of the charge storage device 370 for a given amount of charge injected by the main switch 310. This approach can save space on semiconductor substrates for circuits that include the charge injection compensation circuit 500 compared to circuits that include the charge injection compensation circuit 300, since less charge is transferred per second control pulse 480 and third control pulse 490, and consequently the charge storage device 570 can be smaller since it can store less charge than the charge storage device 370. In general, a capacitance or charge storage capacity and consequently a size of the charge storage device 570 can be related to the charge storage capacity of the main switch 310 and the number of second control pulses 480 and third control pulses 490 that alternate after each first control pulse 315 that controls the main switch 310 to change state to an off or non-conducting state as follows:

$$C_{CSD} = C_{MS} \times 1/(2 \times N)$$

where $C_{CSD}$ is the charge storage capacity of the charge storage device 570 and $C_{MS}$ is the charge storage capacity of the main switch 310 such that the charge storage device 570 can store an amount of charge equivalent to 1/N times an amount of charge injected by the main switch 310 into the switch output node MAIN SWITCH OUTPUT of the main switch 310. N is the number of alternating cycles of the second control pulse 480 and the third control pulse 490 that together transfer a total amount of the charge injected from the main switch 310 into the switch output node MAIN SWITCH OUTPUT. For example, assuming half of the charge injected by the main switch 310 is injected into the switch output node MAIN SWITCH OUTPUT, for the charge storage capacity of the charge storage device 570 to be able to store one half of the charge injected by the main switch 310 into the switch output node MAIN SWITCH OUTPUT, the charge storage capacity of the charge storage device 570 should be one quarter of the charge storage capacity of the main switch 310, and N=2 so that there would be two alternating cycles of the second control pulse 480 and the third control pulse 490 upon the first control pulse 315 controlling the main switch 310 to de-couple the switch input node MAIN SWITCH INPUT from the switch output node MAIN SWITCH OUTPUT of the main switch 310.

In addition, the charge storage device 570 can have a smaller footprint on a semiconductor substrate than the charge storage device 470 because the charge storage device 570 can be focused on the capacitor device alone, and not include the additional portions of NMOS and PMOS transistors and interconnect that do not contribute to a charge storage capacity of the half switch of the charge storage device 470.

Figure 6:
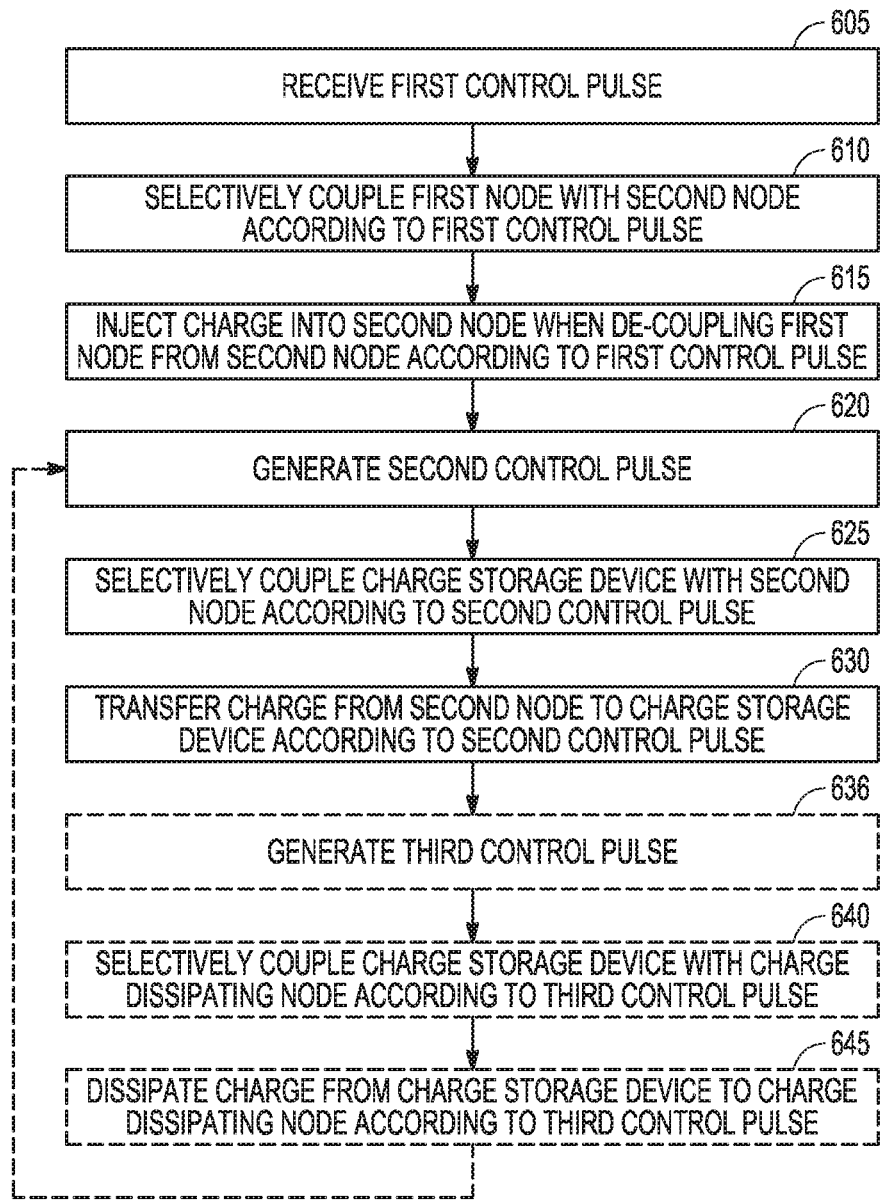
FIG. 6 illustrates a method of compensating for charge injection in a circuit, according to an embodiment.

FIG. 6 illustrates a method 600 of compensating for charge injection in a circuit, according to an embodiment. In an operation 605, a first control pulse is received by a main switch and a pulse generator circuit. The first control pulse can alternate between a logic high value and a logic low value.

In an operation 610, a first node is selectively coupled with a second node by a main switch according to a value of the first control pulse. The main switch can couple the first node with the second node when the first control pulse has a logic high value, and de-couple the first node from the second node when the first control pulse has a logic low value.

In an operation 615, charge is injected into the second node by the main switch when de-coupling the first node from the second node according to the first control pulse. Charge can also be injected into the first node by the main switch when de-coupling the first node from the second node according to the first control pulse. The de-coupling can be when the first control pulse changes logic value, for example, from a logic high value to a logic low value.

In an operation 620, a second control pulse is generated by the pulse generator circuit. The second control pulse can be sequenced to be generated after the first control pulse. The second control pulse can alternate between a logic high value and a logic low value. The second control pulse can be generated with a logic high value upon the first control pulse changing state from a logic high value to a logic low value.

In an operation 625, a charge storage device is selectively coupled with the second node by a first compensation switch according to the second control pulse. The charge storage device can be coupled with the second node upon the de-coupling of the first node from the second node according to the first control pulse. A state of a switch of the charge storage device used to store charge can be controlled according to at least one of the first control pulse and the second control pulse.

A charge storage device can also be selectively coupled with the first node in addition to or instead of the charge storage device being selectively coupled with the second node. All operations described herein with respect to the charge storage device selectively coupled with the second node can equally apply to a charge storage device selectively coupled with the first node.

In an operation 630, charge is transferred from the second node to the charge storage device via the first compensation switch in a conducting configuration according to the second control pulse. Following the charge transfer, the logic value of the second control pulse can be changed, for example, from a logic high value to a logic low value, by the pulse generator circuit.

In an optional operation 635, a third control pulse is generated by the pulse generator circuit. The third control pulse can be generated to be sequenced after the second control pulse. The third control pulse can alternate between a logic high value and a logic low value. The third control pulse can be generated with a logic high value after the second control pulse changes state from a logic high value to a logic low value. The logic value of the third control pulse can be an inverse of the logic value of the second control pulse, and the third control pulse can be a logical inverse of the second control pulse.

In an optional operation 640, the charge storage device is selectively coupled with a charge dissipating node by a second compensation switch according to the third control pulse. The charge storage device can be coupled with the charge dissipating node after the de-coupling of the output node from the charge storage device according to the second control pulse. A voltage level of a terminal of the charge storage device can be controlled according to at least one of the second control pulse and the third control pulse. A state of a switch of the charge storage device used to store charge can be controlled according to at least one of the first control pulse, the second control pulse, and the third control pulse.

In an operation 645, charge is dissipated from the charge storage device to the charge dissipating node. In embodiments using the second compensation switch controlled by the third control pulse, the charge can be dissipated via the second compensation switch in a conducting configuration according to the third control pulse. The charge can also be dissipated slowly by a high resistance value resistor connected from the charge storage device to the charge dissipating node. Following the dissipation of the charge, in embodiments using the second compensation switch controlled by the third control pulse, the logic value of the third control pulse can be changed to a logic low value by the pulse generator circuit to change the state of the second compensation switch to a non-conducting configuration and end the discharge of the charge storage device to the charge dissipating node.

In some embodiments, operations 620-645 can be repeated numerous times (e.g., N times) in sequence to generate alternating second control pulses and third control pulses upon the main switch de-coupling the input node from the output node according to the first control pulse. By repeating operations 620-645 N times upon the main switch de-coupling the input node from the output node according to the first control pulse, the charge storage device can be 1/N of the size of the charge storage device when the operations 620-645 are not repeated N times, and a fraction of 1/N of the charge injected by the main switch into the output node can be transferred from the output node to the charge storage device and dissipated for each time the operations 620-645 are repeated.

The embodiments discussed herein facilitate charge injection compensation to be performed using less semiconductor floorplan space or circuit area than previously possible, thereby facilitating charge injection compensation for circuits that would otherwise not be compensated due to the large semiconductor floorplan space or circuit area that would have been required, for example, circuits including large area switch devices. The embodiments discuss herein facilitate analog signals being routed to analog to digital converters by switch devices to have higher fidelity for more accurate conversions to digital signals, as the compensation of charge injection by the switch devices facilitates a reduction in nonlinearities due to the charge injection in the analog signals when the analog signals are converted to digital signals by the analog to digital converters.

Any feature of any of the embodiments described herein can optionally be used in combination with any other embodiment. Also, any of the embodiments described herein can optionally include any subset of the components or features discussed herein.

VARIOUS NOTES & EXAMPLES

Each of the non-limiting examples described herein can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

For example, while the impedance elements and the switches are shown in one order between the input terminals and the summing nodes in the drawings, this should not be construed as limiting, because in various embodiments, the impedance elements and the switches can be disposed in a different order while maintaining the same functional performance, according to the understanding of one of ordinary skill in the art in view of the teachings herein. In addition, a single impedance element in the drawings can be replaced by a plurality of different impedance elements while maintaining a same functional performance, and a single switch in the figures can be replaced by a plurality of different switches while maintaining a same functional performance, according to the understanding of one of ordinary skill in the art in view of the teachings herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like.

Such code can include computer readable instructions for performing various methods. The code can form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A charge injection compensation circuit to dissipate charge injected by an opening of a switch, the circuit comprising:
    a first switch to couple a first node of the first switch with a second node of the first switch using a first control pulse, wherein an opening of the first switch causes an injection of charge stored in the first switch into the second node;
    a charge storage device configured to couple to the second node of the first switch and configured to receive an amount of charge that approximates the injected charge stored in the first switch, wherein a charge storage capacity of the charge storage device is a fraction of the charge storage capacity of the first switch to store an amount of charge equivalent to an amount of charge injected by the first switch; and
    a second switch coupled between the second node of the first switch and the charge storage device, the second switch to couple the first node of the first switch or the second node of the first switch with the charge storage device using a second control pulse to transfer the injected charge caused by the opening of the first switch to the charge storage device, the second control pulse being timed to control the second switch to close upon the first control pulse controlling the first switch to open.

2. The charge injection compensation circuit of claim 1, further comprising:
    a pulse generator circuit to generate the second control pulse in response to the received first control pulse; and
    a charge dissipation device that transfers charge from the charge storage device to a charge dissipating node.

3. The charge injection compensation circuit of claim 2, wherein the charge dissipation device includes a third switch to couple the charge storage device with the charge dissipating node using a third control pulse generated by a pulse generator circuit to transfer charge, the third control pulse being timed to control the third switch to close after the second control pulse controls the second switch to open.

4. The charge injection compensation circuit of claim 1, wherein a charge storage capacity of the charge storage device is a fraction $1/(2 \times N)$ of a charge storage capacity of the first switch to store an amount of charge equivalent to $1/N$ of an amount of charge injected by the first switch, and the pulse generator circuit is configured to provide N sequential second control pulses upon a first control pulse controlling the first switch to open.

5. The charge injection compensation circuit of claim 1, wherein the charge storage device includes a fourth switch that is a half of a size of the first switch to store an amount of charge equivalent to an amount of charge injected by the first switch.

6. The charge injection compensation circuit of claim 1, wherein the charge storage device includes a fourth switch that is a fraction $1/(2 \times N)$ of a size of the first switch to store an amount of charge equivalent to $1/N$ of an amount of charge injected by the first switch, and the pulse generator circuit is configured to provide N sequential second control pulses upon a first control pulse controlling the first switch to open.

7. The charge injection compensation circuit of claim 1, wherein the charge storage device includes a capacitor having a charge storage capacity to store an amount of charge equivalent to an amount of charge injected by the first switch.

8. The charge injection compensation circuit of claim 1, wherein the charge storage device includes a capacitor having a charge storage capacity to store an amount of charge equivalent to $1/N$ of an amount of charge injected by the first switch, and the pulse generator circuit is configured to provide N sequential second control pulses upon a first control pulse controlling the first switch to open.

9. The charge injection compensation circuit of claim 8, further comprising:
    a charge dissipation device that transfers charge from the charge storage device to a charge dissipating node, wherein:

a first terminal of the capacitor is selectively coupled with the coupled one of the first node and second node of the first switch via the second switch and selectively coupled with the charge dissipating node via a third switch using a third control pulse generated by the pulse generator circuit; and a second terminal of the capacitor is controlled to have a varying voltage using the third control pulse;

wherein the third control pulse is timed in sequence after the second control pulse to control the third switch to close after the second control pulse controls the second switch to open, and the pulse generator circuit is configured to provide N sequential pairs of second control pulses and third control pulses.

10. The charge injection compensation circuit of claim 1, wherein the charge stored in the first switch includes at least one of channel charge and gate drive feed-through.

11. A method of compensating a charge injection circuit to dissipate charge injected by an opening of a switch, the method comprising:

coupling a first node of a first switch with a second node of the first switch using a received first control pulse;

injecting charge stored in the first switch into at least one of the first node and the second node when de-coupling the first node from the second node;

coupling the first node of the first switch or the second node of the first switch with a charge storage device using a second control pulse generated in response to the received first control pulse, the second control pulse being timed to control the coupling of the first node or the second node with the charge storage device upon the de-coupling of the first node from the second node;

transferring amount of charge that approximates the injected charge stored in the first switch from the first node or second node to the charge storage device, wherein a charge storage capacity of the charge storage device is a fraction of the charge storage capacity of the first switch to store an amount of charge equivalent to an amount of charge injected by the first switch; and transferring charge from the charge storage device to a charge dissipating node.

12. The method of claim 11, wherein transferring charge from the charge storage device to the charge dissipating node includes coupling the charge storage device with the charge dissipating node using a third control pulse, the third control pulse being generated in sequence following the second control pulse and timed to control the coupling of the charge storage device with the charge dissipating node after the second control pulse controls the de-coupling of the charge storage device from the first node or the second node.

13. The method of claim 12, further comprising generating alternating second control pulses and third control pulses upon the first control pulse controlling the decoupling of the first node from the second node;
wherein:
a fraction of the charge injected into the first node or second node is transferred from the first node or second node to the charge storage device per second control pulse instance; and
coupling the first node or second node with the charge storage device using the second control pulse, transferring charge from the first node or second node to the charge storage device, coupling the charge storage device with the charge dissipating node using the third control pulse, and transferring the charge from the charge storage device to the charge dissipating node are repeatedly performed in sequence using the alternating second control pulses and third control pulses.

14. The method of claim 12, further comprising:
selectively de-coupling the charge storage device from the first node or second node using the second control pulse after the transferring of charge from the first node or second node to the charge storage device; and
selectively de-coupling the charge storage device from the charge dissipating node using the third control pulse after the transferring of charge from the charge storage device to the charge dissipating node.

15. The method of claim 12, further comprising controlling a state of a charge storage switch of the charge storage device using at least one of the second control pulse and the third control pulse.

16. The method of claim 11, wherein the charge storage device comprises a capacitor having a first terminal selectively coupled with the first node or second node using the second control pulse and selectively coupled with the dissipating node according to the third control pulse; and
further comprising controlling a voltage level of a second terminal of the capacitor using the third control pulse.

17. The method of claim 11, wherein the charge stored in the first switch includes at least one of channel charge and gate drive feed-through.

18. A switching system that compensates for charge injection, the system comprising:

a first means for coupling a first electronic circuit with a second electronic circuit using a first control pulse, the first means for coupling to inject charge stored in the first means for coupling into the second electronic circuit when the first means for coupling opens;

means for storing charge coupleable to the second node of the first means for coupling and configured to receive an amount of charge that approximates the injected charge stored in the first means for coupling, wherein a charge storage capacity of the means for storing charge is a fraction of the charge storage capacity of the first means for coupling to store an amount of charge equivalent to an amount of charge injected by the first means for coupling; and a second means for coupling, the second means for coupling positioned between the second node of the first means for coupling and the means for storing charge, the second means for coupling configured to couple the charge storage device with the second electronic circuit using a second control pulse to transfer charge to the means for storing charge, the second control pulse being timed to control the second means for coupling to close upon the first control pulse controlling the first means for coupling to open.

19. The system of claim 18, wherein the means for storing charge includes a fourth means for coupling that is half of a size of the first means for coupling to store an amount of charge equivalent to an amount of charge injected by the first means for coupling.

20. The system of claim 18, wherein the charge storage device includes a fourth means for coupling that is a fraction $1/(2 \times N)$ of a size of the first means for coupling to store an amount of charge equivalent to $1/N$ of an amount of charge injected by the first means for coupling.

21. The system of claim 18, wherein a pulse generator circuit is configured to sequentially generate the second control pulse and a third control pulse in response to the received first control pulse, the system further comprising:
a third means for coupling to couple the charge storage device with a charge dissipating node using the third control pulse to transfer charge, the third control pulse being timed to control the third means for coupling to close after the second control pulse controls the second means for coupling to open.

22. The system of claim 21, wherein a charge storage capacity of the means for storing charge is a fraction $1/(2\times N)$ of the charge storage capacity of the first means for coupling to store an amount of charge equivalent to $1/N$ of an amount of charge injected by the first means for coupling, and a pulse generator circuit is configured to provide N alternating second control pulses and third control pulses upon the first control pulse controlling the first means for coupling to open.

23. The system of claim 18, wherein the charge stored in the first means for coupling includes at least one of channel charge and gate drive feed-through.

* * * * *